United States Patent [19]

Soda

[11] Patent Number: 5,760,653
[45] Date of Patent: Jun. 2, 1998

[54] PHASE-LOCKED LOOP FOR CLOCK RECOVERY

[75] Inventor: Masaaki Soda, Tokyo, Japan

[73] Assignee: NEC Corporation, Japan

[21] Appl. No.: 655,472

[22] Filed: May 30, 1996

[30] Foreign Application Priority Data

May 31, 1995 [JP] Japan ................ 7-156897

[51] Int. Cl.⁶ ................................................ H03D 3/24
[52] U.S. Cl. .................. 331/1 A; 331/25; 331/18; 331/23; 327/156; 327/263; 327/264
[58] Field of Search ................... 331/18, 8, 23, 331/1 A, 25; 375/376; 327/156, 7, 9, 263, 264, 268, 283, 290

[56] References Cited

U.S. PATENT DOCUMENTS

| | | | |
|---|---|---|---|
| 3,991,322 | 11/1976 | Bush et al. | 307/221 D |
| 4,229,759 | 10/1980 | Harwood et al. | 358/19 |
| 4,321,488 | 3/1982 | Srivastava | 307/353 |
| 4,371,975 | 2/1983 | Dugan | 375/120 |
| 4,607,296 | 8/1986 | Smidth | 360/51 |
| 4,682,118 | 7/1987 | Thiel | 329/122 |
| 4,866,397 | 9/1989 | Kimyachioglu | 330/252 |
| 5,066,877 | 11/1991 | Hamano et al. | 307/603 |
| 5,231,394 | 7/1993 | Sato | 341/50 |
| 5,243,240 | 9/1993 | Murakami et al. | 307/603 |

FOREIGN PATENT DOCUMENTS 2146863  4/1985  United Kingdom.

OTHER PUBLICATIONS

Zhi–Gong Wang, et al., 7.5 GB/s Monolithically Integrated Clock Recovery Circuit Using PLL and 0.3–μm Gate Length Quantum Well HEMT's, *IEEE Journal of Solid–State Circuits*, vol. 29, No. 8, pp. 995–997, Aug. 1994.

*Primary Examiner*—Timothy P. Callahan
*Assistant Examiner*—An T. Luu
*Attorney, Agent, or Firm*—Ostrolenk, Faber, Gerb & Soffen, LLP

[57] ABSTRACT

A PLL circuit includes a sampling pulse generator and a loop circuit using a sample and hold circuit as a phase detector. The sampling pulse generator generates a sampling pulse signal at each level transition of an NRZ input signal. The sample and hold circuit samples a clock signal and hold a voltage signal corresponding to a voltage of the clock signal according to the sampling pulse signal. A voltage-controlled oscillator included in the loop circuit generates the clock signal whose frequency is controlled based on tho voltage signal received from the sample and hold circuit through a loop filter. The voltage signal remains at an appropriate level even when the NRZ input signal remains at the same level for a relatively long time. The sampling pulse generator includes a delay circuit for delaying the NRZ input signal and an exclusive-OR circuit receiving the NRZ input signal and the delayed signal.

19 Claims, 5 Drawing Sheets

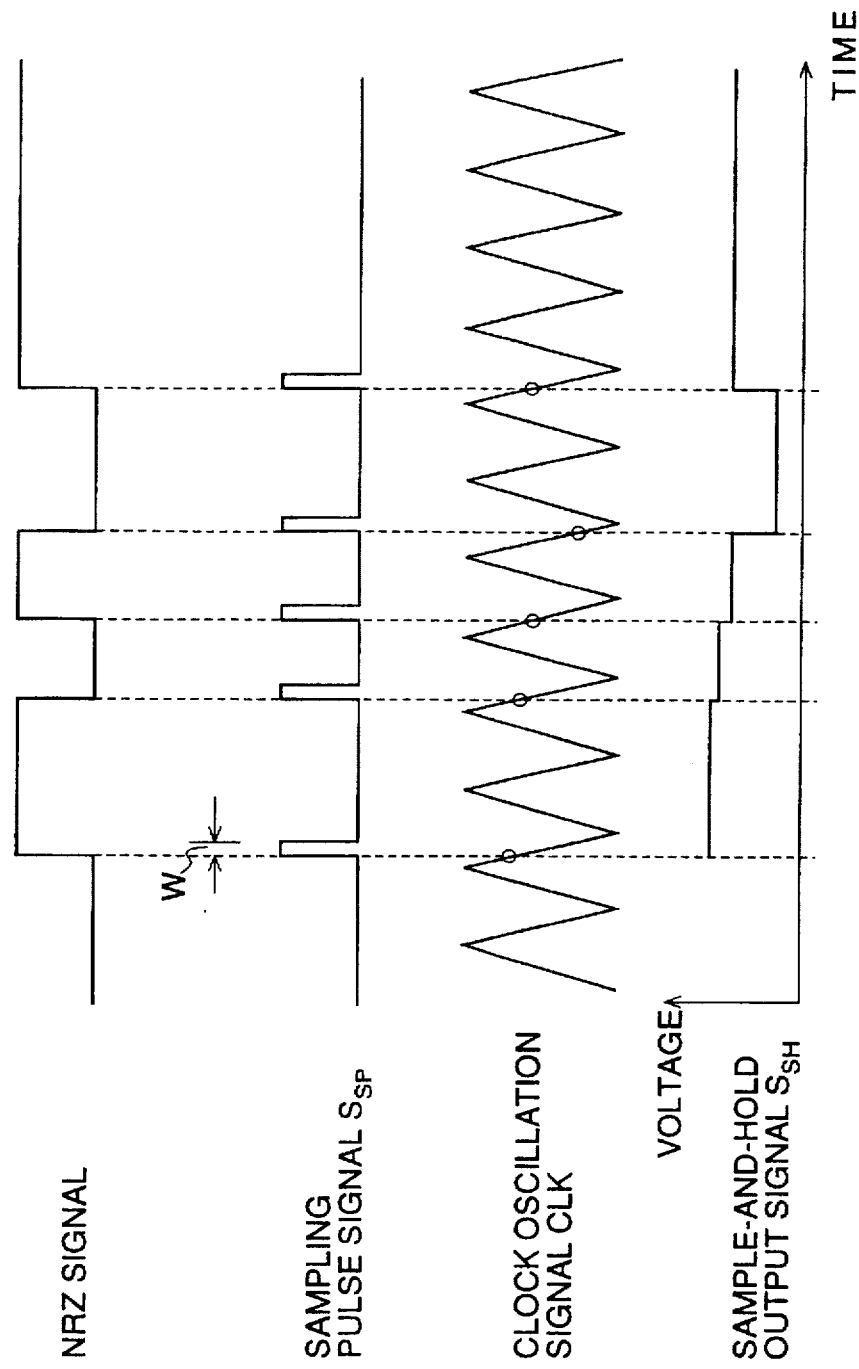

PHASE-LOCKED LOOP FOR CLOCK RECOVERY

BACKGROUND OF THE INVENTION

1. Field of the Invention

The present invention relates to a phase-locked loop (PLL) circuit, and in particular to a clock recovery circuit using the PLL circuit which recovers a clock signal from an NRZ (non-return to zero) signal.

2. Description of the Related Art

According to the well-known NRZ signalingmethod, the voltage does not necessarily return to a zero state after each bit is transmitted. Therefore, the NRZ signal remains at the same level for the entire bit interval and may remains at the same level for several bit intervals when the same value is transmitted in succession. Since such a signal is not self-clocking, it is necessary to produce a clock component by using a nonlinear operation such as a differentiating and unipolar conversion method. As an example, a monolithically integrated clock recovery circuit is proposed by Zhi-Gong Wang et al. (IEEE JOURNAL OF SOLID-STATE CIRCUITS, VOL. 29, NO. 8, pp 995–997, AUGUST 1994).

FIG. 1 shows a block diagram of a conventional clock recovery circuit using the PLL technique in a demodulator. The clock recovery circuit as shown in FIG. 1 is usually formed with an integrated circuit. In this example, the circuit is provided with a differentiating circuit 1, a bipolar-to-unipolar converter (or a full-wave rectifier) 2, and a PLL circuit comprising a phase detector 3, a low-pass filter 4, and a voltage-controlled oscillator (VCO) 5. Receiving an NRZ input signal, the differentiating circuit 1 generates a bipolar pulse signal wherein positive pulses are generated at rising edges of the NRZ signal and negative pulses at falling edges. The bipolar pulse signal is output to the converter 2 which converts the bipolar pulse signal into a unipolar pulse signal having unipolar pulses positioned at each level transition of the NRZ input signal. In other words, clock spectrum components are synthesized by the differentiating and unipolar conversion method like this.

The unipolar pulse signal is output to the phase detector 3 which is comprised of a multiplier mixing the unipolar pulse signal with a clock signal generated by the voltage-controlled oscillator 5 to produce A detection signal having a waveform as shown in the figure. After passing through the low-pass filter 4, the detection signal is used as a voltage controlling signal of the voltage-controlled oscillator 5. The low-pass filter 4 may be formed with a passive filter comprising a capacitor or an active filter comprising an operational amplifier and a capacitor.

A similar clock recovery circuit is disclosed in Japanese Patent Laid-open publication No. SHO 58-156247. This circuit employs a PLL circuit such that a voltage-controlled oscillator is controlled according to a phase difference between an rising or falling edge of the NRZ signal and a rising or falling edge of a signal produced by sampling the NRZ signal according to the output of the voltage-controlled oscillator. More specifically, the phase difference is detected by a phase detector and the detection signal corresponding to the phase difference is supplied to the voltage-controlled oscillator as a voltage controlling signal through a low-pass filter.

However, the conventional PLL circuits mentioned above provide a relatively small DC component of the detection signal of the phase detector. Therefore, they have the disadvantage that the voltage controlling signal of the voltage-controlled oscillator becomes lower when the NRZ signal remains at the same level multiple times in succession. Because the NRZ signal remaining at the same level in succession causes the detection signal of the phase detector to fall to zero, resulting in discharge of the capacitor included in the low-pass filter. Such a voltage change of the voltage controlling signal causes the increased jitters or the clock signal generated by the voltage-controlled oscillator. Especially, in the case where such a clock recovery circuit is used in the demodulator of a radio communication system, the increased jitters of the recovered clock deteriorates the quality of communications.

SUMMARY OF THE INVENTION

An object of the present invention is to provide a circuit which achieves a stable oscillation operation according to an NRZ input signal.

Another object of the present invention is to provide a clock recovery circuit using a PLL circuit which achieves the Reduced jitters of a clock oscillation signal recovered from an NRZ input signal.

Still another object of the present invention is to provide a clock recovery circuit using a PLL circuit which easily provides a monolithic-integrated circuit.

Further still another object of the present invention is to provide a clock recovery circuit using a PLL circuit which achieves a stable clock recovery according to a high-frequency NRZ input signal.

A circuit according to the present invention is comprised of a pulse generator for generator a pulse signal of a predetermined pulse width at each level transition of an NRZ input signal, a phase detector for detecting and storing a voltage signal corresponding to a voltage of a periodic signal at a time instant of each pulse of the pulse signal, and an oscillator for generating the periodic signal whose frequency is controlled based on the voltage signal stored in the phase detector.

Preferably, the phase detector is comprised of a sample and hold circuit. The pulse generator is preferably comprised of a delay circuit and an exclusive-OR circuit. The delay circuit delays the input signal by a predetermined time period to produce a delayed input signal. Receiving tho input signal and the delayed input signal, the exclusive-OR circuit produces the pulse signal. More specifically, the delay circuit is comprised of a differential amplifier receiving the input signal and producing a differential output signal on a differential output terminals and a Lime-constant circuit for delaying the input signal to produce the delayed input signal, which is connected to the differential output terminals of the differential amplifier.

A PLL circuit according to the present invention includes a phase detector for detecting and storing a voltage signal corresponding to a voltage of a periodic signal at each level transition of an NRZ input signal, a loop filter receiving the voltage signal from the phase detector and producing a voltage controlling signal, and a voltage-controlled oscillator for generating the periodic signal whose frequency is controlled according to the voltage controlling signal received from the loop filter. As described above, preferably, the phase detector is comprised of a sample and hold circuit.

According to another aspect of the present invention, a clock recovery circuit using the PLL circuit is comprised of a sampling pulse generator for generating a sampling pulse signal or a predetermined pulse width at each level transition of an NRZ input signal, a phase detector or a sample and hold circuit for sampling a clock signal according to the sampling pulse signal and holding a voltage signal corresponding to a voltage of the clock signal at the time instant, a filter receiving the voltage signal and producing a controlling signal, and a controlled oscillator for generating the clock signal whose frequency is controlled according to the controlling signal received from the filter. Preferably, the sampling pulse generator is comprised of a delay circuit and an exclusive-OR circuit.

As described above, according to the present invention, the phase detector uses the sampling pulse signal to sample the clock signal and to hold a voltage signal corresponding to the clock signal at the time instant of each pulse of the sampling pulse signal. Since the voltage signal is retained and updated according to the sampling pulse signal, the oscillator is stably controlled based on the voltage signal. Specifically, even when the NRZ input signal remains at the same level for a long time and the interval of sampling pulses becomes longer, a variation of the voltage signal is reduced with the voltage retained at a previously stored level. Therefore, the output of the phase detector has a large DC component at all times, resulting in reduced clock jitters and stable oscillation of the oscillator.

As described above, according to the present invention, since the output of the phase detector is retained at an approximately predetermined level even in the case where the NRZ input signal successively remains at the same level, the S/N ratio of the loop in the clock recovery circuit is improved, and the jitters of the clock can be decreased. Therefore, the clock recovery circuit according to the present invention can provide efficient optical communications.

Further, since the clock recovery circuit using the PLL circuit according to the present invention is monolithically integrated to easily form a high-speed circuit, with parameter modifications, the clock recovery circuit is able to normally work when receiving the high-frequency NRZ signal of, for example, 2.4 Gb/s.

BRIEF DESCRIPTION OF THE DRAWINGS

FIG. 3 is a timing chart showing the operation of the embodiment as shown in FIG. 2;

DETAILED DESCRIPTION OF THE PREFERRED EMBODIMENTS

Figure 2:
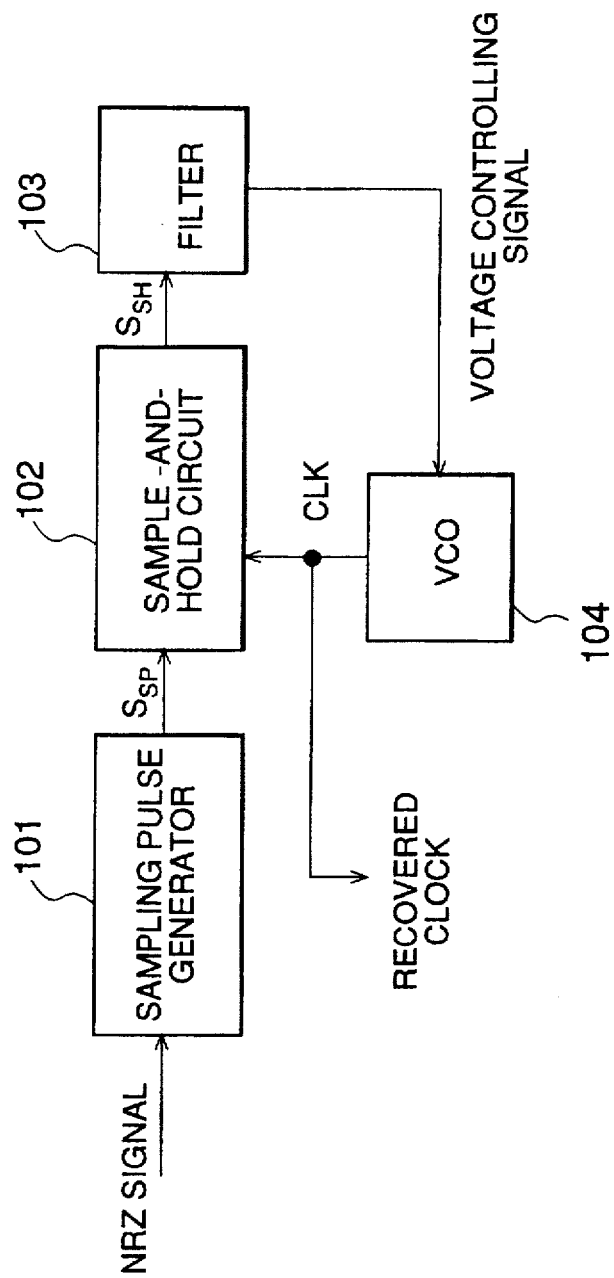
FIG. 2 is a block diagram showing a clock recovery circuit according to an embodiment of the present invention.

Referring to FIG. 2, a clock recovery circuit according to an embodiment of the present invention is comprised of a sampling pulse generator 101 and a PLL circuit. The sampling pulse generator 101 receives an NRZ signal and generates a sampling pulse signal $S_{sp}$ according to level transitions of the NRZ signal. The sampling pulse signal $S_{sp}$ consists of unipolar pulses positioned at each level transition of the NRZ signal.

The PLL circuit is comprised of a sample-and-hold (S&H) circuit 102, a filter 103, and a voltage-controlled oscillator (VCO) 104. The S&H circuit 102 samples and holds a voltage of a clock oscillation signal CLK according to the sampling pulse signal $S_{sp}$ and produces an S&H output signal $S_{SH}$. The filter 103 includes a low-pass filter (LPF) so as to eliminate high-frequency components and produce a voltage controlling signal. The LPF is formed with an active filter comprising an operational amplifier. The voltage-controlled oscillator 104 generates the clock oscillation signal CLK whose frequency varies according to the voltage controlling signal received from the S&H circuit 102 through the filter 103. After phase-locked, the clock oscillation signal CLK is used as the recovered clock.

An operation of the clock recovery circuit of this embodiment will be described with reference to the timing chart.

shown in FIG. 3, the sampling pulse generator 101 receives the NRZ signal, and generates the sampling pulse signal $S_{sp}$ with each pulse having a predetermined pulse width W. A pulse of the sampling pulse signal $S_{sp}$ is generated at each level transition of the NRZ signal, that is, at a rising edge and a falling edge of the NRZ signal. The S&H circuit 102 performs a well-known sample and hold operation according to the sampling pulse signal $S_{sp}$ received from the sampling pulse generator 101.

More specifically; as shown in FIG. 3, at each LOW to HIGH transition of the sampling pulse signal $S_{sp}$, the S&H circuit 102 Samples a voltage of the clock oscillation signal CLK received from the VCO 104 and holds the sampled voltage until the subsequent sampling pulse rises. Therefore, the sampled voltage, that is, the S&H output signal $S_{sh}$, is kept at a predetermined level when the phase of the clock oscillation signal CLK synchronizes with the NRZ signal. However, as the phase of the clock oscillation signal CLK deviates from that of the NRZ signal, the S&H output signal $S_{sh}$ varies in voltage from the predetermined level. In other words, the S&H output signal $S_{sh}$ indicates the amount of phase deviation of the clock oscillation signal CLK. Since the sampled voltage is retained in the S&H circuit 102, the S&H output signal $S_{sh}$ is normally kept at approximately the predetermined level even when the NRZ signal remains at the same level for a relatively long time. The S&H output signal $S_{sh}$ is smoothed through the filter 103 and enters the control terminal of the VCO 104 as the voltage controlling signal. The VCO 104 outputs the clock oscillation signal CLK whose phase is adjusted to be in synchronization with the NRZ signal according to the voltage controlling signal.

Figure 1:
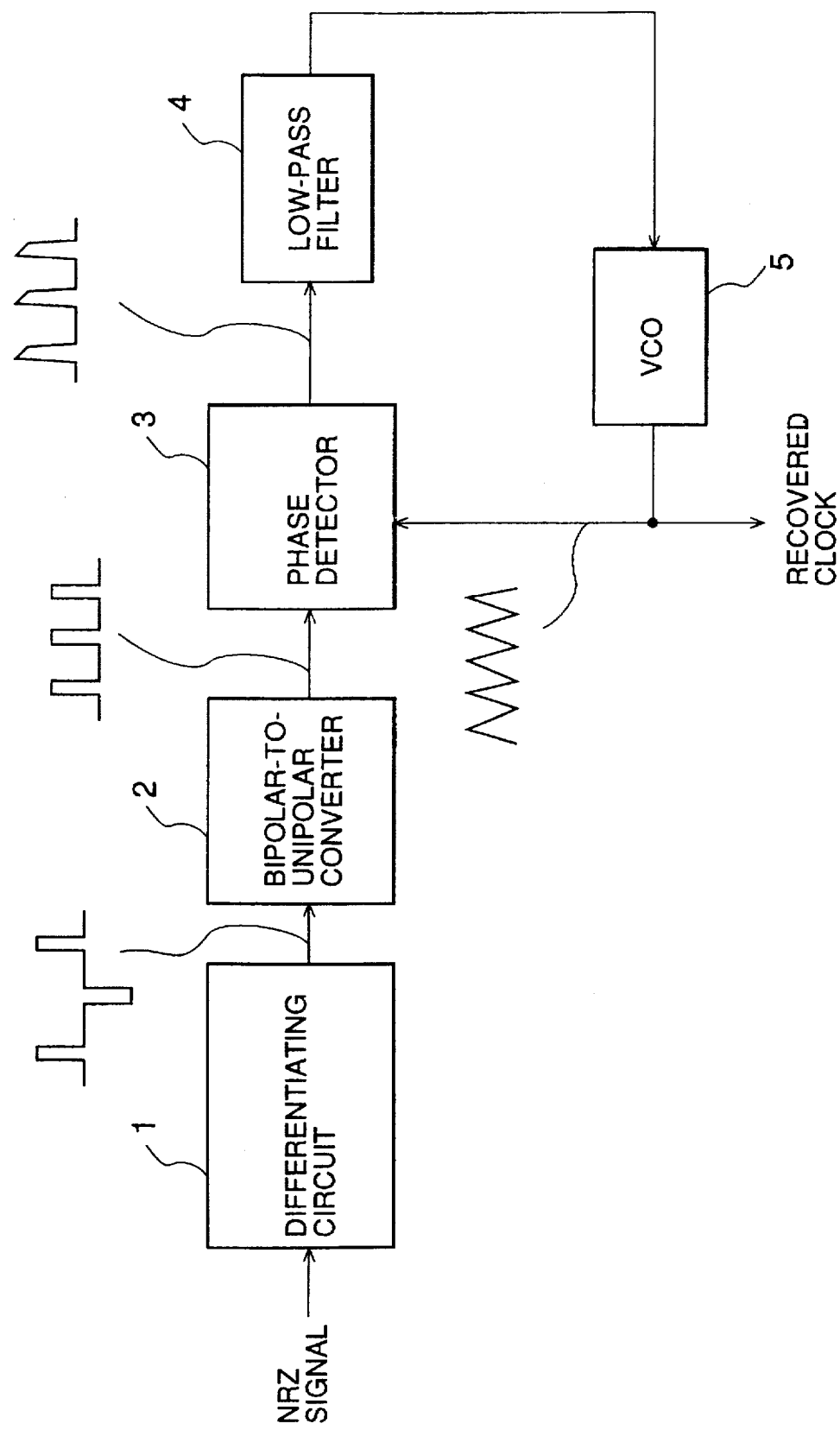
FIG. 1 is a block diagram showing an example of a conventional clock recovery circuit.

In the clock recovery circuit mentioned above, the DC component of the S&H output signal $S_{sh}$ which is tho input voltage of the filter 103 is usually five times that of the conventional circuit as shown in Fig. 1. Therefore, compared to the conventional clock recovery circuit, the Signal-to-Noise ratio of the PLL is improved, and the clock jitters is approximately reduced by a factor of 3.

Figure 4A:
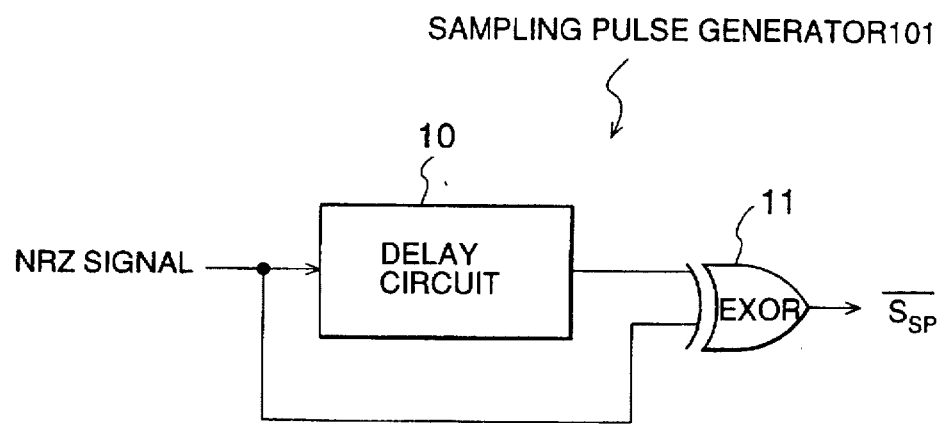
FIG. 4A is a block diagram showing an example of a sampling pulse generator as shown in FIG. 2.

Referring to FIG. 4A, the sampling pulse generator 101 may be comprised of a delay circuit 10 and an exclusive-OR (EX-OR) circuit 11. The delay circuit 10 delays the NRZ signal only by a predetermined time period, and the EX-OR circuit 11 performs the exclusive OR function on the delayed NRZ signal and the input NRZ signal to produce the sampling pulse signal $S_{sp}$ indicating the level transitions of the NRZ signal. Therefore, a pulse width W of the sampling pulse signal $S_{sp}$ is determined depending on the delay time period of the delay circuit 10. It should be noted that the sampling pulse signal $S_{sp}$ is produced by inverting the output of the EX-OR circuit 11.

Figure 4B:
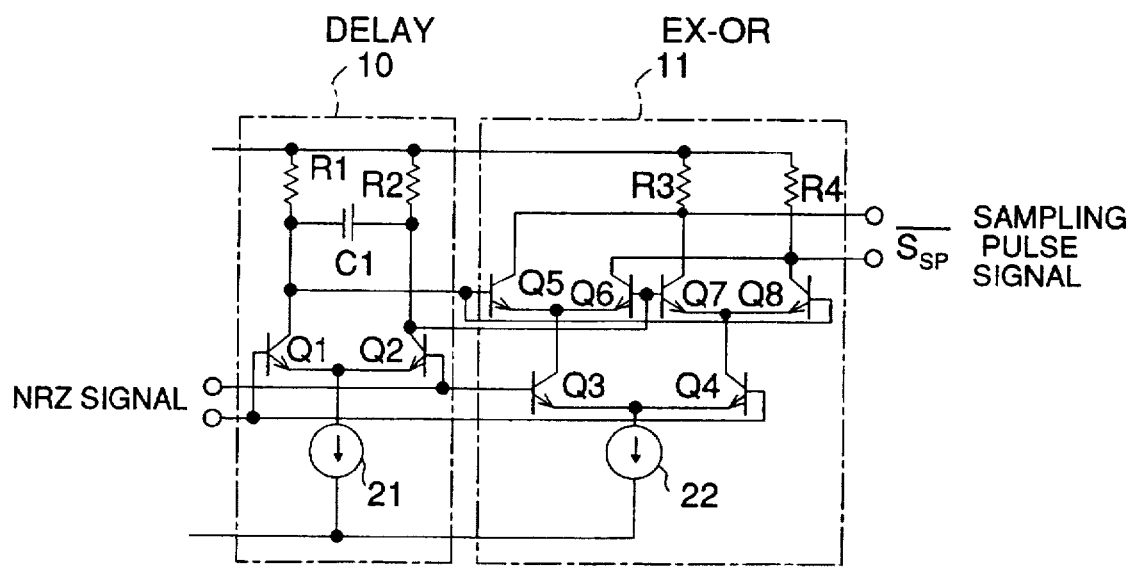
FIG. 4B is a more detailed circuit diagram showing the sampling pulse generator as shown in FIG. 4A.

As shown in FIG. 4B, the delay circuit 10 is comprised of a pair of transistors Q1 and Q2 which form a differential input amplifier, load resistors R1, R2 and a capacitor C1 of the transistors Q1 and Q2 which determine the delay time period, and a constant-current source 21. The output voltage of the transistors Q1 and Q2 changes with a time constant determined by the resistors R1, R2 and the capacitor C1. The EX-OR circuit 11 is comprised of a differential pair of transistors Q3 and Q4 which receives the NRZ signal, a differential pair of transistors Q5 and Q6 which receives an output voltage of the delay circuit 10, a differential pair of transistors Q7 and Q8, load resistors R3 and R4, and a constant-current source 22. The respective pairs of transistors Q5, Q6 and transistors Q7, Q8 are set so as to bring into conduction (ON) when an output voltage of the transistors Q1 and Q2 in the delay circuit 10 exceeds a predetermined threshold voltage.

More specifically, the differential sampling pulse signal $S_{sp}$ is kept at a low level when the NRZ signal is low since the respective differential pairs of transistors Q1, Q2 and Q3, Q4 are in the state of non-conduction (OFF) and the respective pairs of transistors Q5, Q6 and Q7, Q8 are in the state of conduction (ON). When the NRZ signal goes high, the differential pairs of transistors Q1, Q2 and Q3, Q4 are forced into conduction (ON), but there is a delay caused by the time constant determined with the resistors R1, R2 and the capacitor C1 before the differential pairs of transistors Q5, Q6 and Q7, Q8 are forced into non-conduction (OFF). Therefore, the sampling pulse signal $S_{sp}$ goes high for only the delay time period after the NRZ signal goes high, and then goes low after a lapse of the delay time period. In other words, the differential sampling pulse signal $S_{sp}$ has the pulse width W of the delay time caused by the time constant.

Since the time constant of the delay circuit 10 can be set depending on the resistors R1, R2 and the capacitor C1, a desired pulse width w of the sampling pulse signal $S_{sp}$ can be determined by setting the resistors R1, R2 and the capacitor C1. In the case where the resistance of the load resistors R1 and R2 and the capacitance of the capacitor C1 are set to 1 KΩ and 50 fF, respectively, when an NRZ signal of 2.4 Gb/s is applied to the sampling pulse generator 101, the sampling pulse signal $S_{sp}$ with the pulse width of 10 psec is generated at each level transition of the NRZ signal. Thus, it was experimentally confirmed that the sampling pulse generator 101 as shown in FIG. 4B was able to normally operate when receiving the high-frequency NRZ signal of 2.4 Gb/s.

Figure 5:
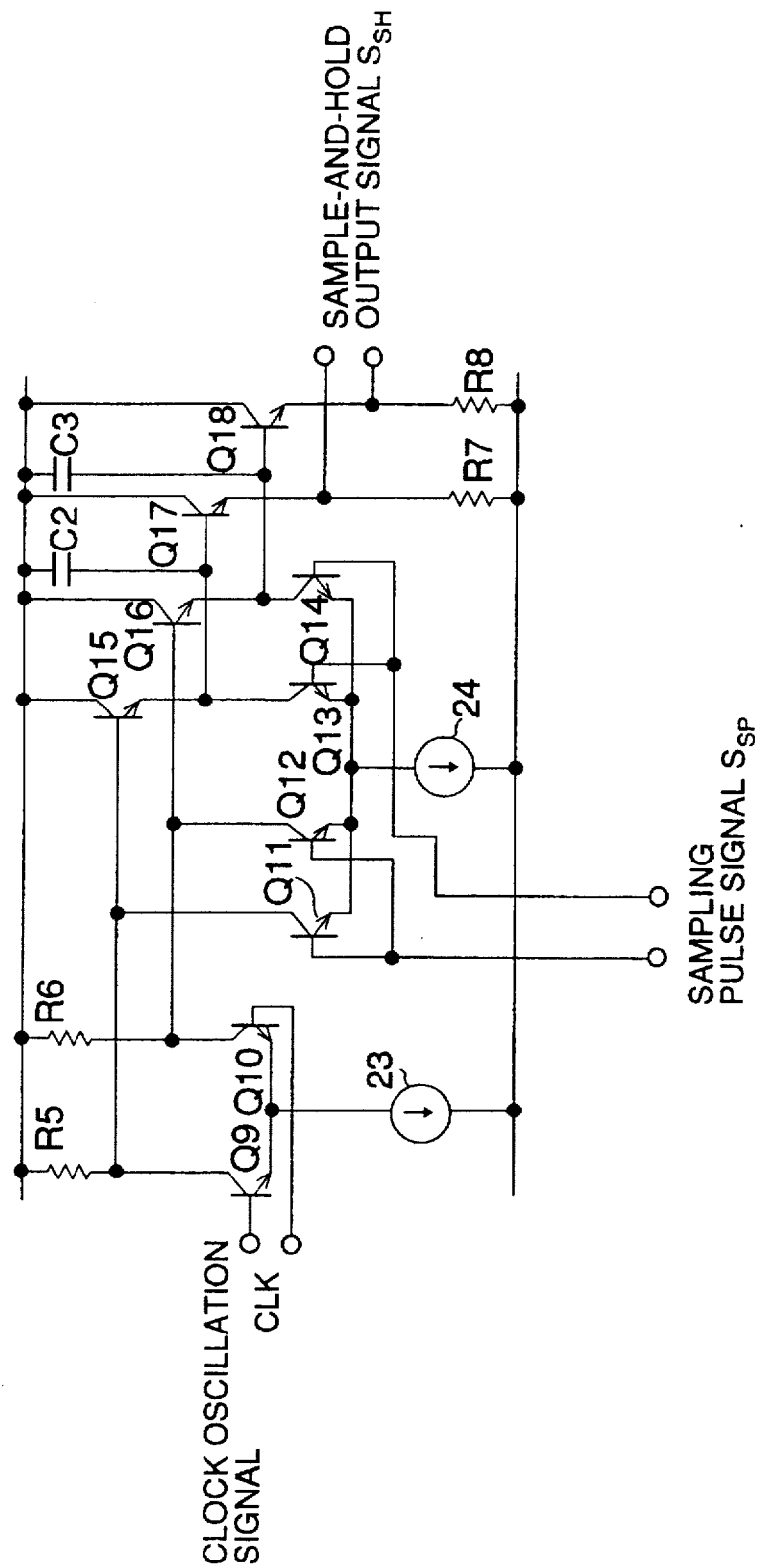
FIG. 5 is a circuit diagram showing an example of a sample-and-hold circuit as shown in FIG. 2.

Referring to FIG. 5, a clock oscillation signal CLK generated by the VCO 104 is applied to the bases of a differential pair of transistors Q9 and Q10 wherein their collectors are connected to load resistors R5 and R6 and their emitters to a constant-current source 23. The differential sampling pulse signal $S_{sp}$ is applied to the bases of differential pairs of transistors Q11–Q14. The respective collectors of the transistors Q11 and Q12 are connected to the collectors of the transistors Q9 and Q10 and further to the bases of the transistors Q15 and Q16. The emitters of the transistors Q15 and Q16 are connected to the collectors of the transistors Q13 and Q14. The emitters of the transistors Q11–Q14 are connected in common to the constant-current source 24. The base of a buffer transistor Q17 is connected to the emitter of the transistor Q15 and to a hold capacitor C2. Similarly, the base or a buffer transistor Q18 is connected to the emitter of the transistor Q16 and to a hold capacitor C3. The S&H output signal $S_{sh}$ appears on the emitters of the buffer transistors Q17 and Q18.

When the sampling pulse signal $S_{sp}$ of a pulse width w goes high, the differential transistors Q11–Q14 are forced into conduction, causing currents to pass through the transistors Q15 and Q16, respectively. Since the respective currents passing through the transistors Q15 and Q16 are proportional to voltages on the collectors of the transistors Q9 and Q10 at the time when the sampling pulse signal $S_{sp}$ goes high, the respective voltages of the clock oscillation signal CLK at that time are sampled and stored into the hold capacitors C1 and C3 through the transistors Q15 and Q16. When the sampling pulse signal $S_{sp}$ goes low, the differential transistors Q11–Q14 are forced into non-conduction, which stops current passing through the transistors Q15 and Q16. Therefore, the respective sampled voltages at that time are retained in the capacitors C2 and C3. The buffer transistors Q17 and Q18 outputs the S&H output signal $S_{sh}$ corresponding to the sampled voltages retained in the hold capacitors C2 and C3, respectively.

As described above, the circuit according to the embodiment uses the active filter for the filter 103, the sampling pulse generator 101 of FIG. 4B, and the sample-and-hold circuit 102 of FIG. 5. Therefore the circuit components may be easily monolithically integrated.

What is claimed is:

1. A circuit comprising:

a pulse generator generating a pulse signal of a predetermined pulse width at each level transition of an input signal having an NRZ (non return to zero) signaling method;

a detector detecting a voltage signal corresponding to a voltage of a periodic signal at a time corresponding to each pulse of the pulse signal;

a storage device storing the voltage signal detected at the time of each pulse; and an oscillator generating the periodic signal whose frequency is controlled based on the voltage signal stored in the storage device.

2. The circuit according to claim 1, wherein the pulse generator comprises:

a delay circuit for delaying the input signal by a predetermined time period to produce a delayed input signal; and an exclusive-OR circuit for receiving the input signal and the delayed input signal to produce the pulse signal.

3. The circuit according to claim 2, wherein the delay circuit comprises:

a differential amplifier receiving the input signal and producing a differential output signal on differential output terminals; and a time-constant circuit connected to the differential output terminals of the differential amplifier, for delaying the input signal to produce the delayed input signal.

4. The circuit according to claim 3, wherein the exclusive-OR circuit comprises:

a first differential amplifier receiving the input signal and producing a first and second differential output signals on a first and second differential output terminals, respectively;

a second differential amplifier receiving the delayed input signal, the second differential amplifier being connected in series to the first differential output terminal of the first differential amplifier, and differential output terminals of the second differential amplifier being connected to differential pulse signal output terminals; and a third differential amplifier receiving the delayed input signal, the third differential amplifier being connected in series to the second differential output terminal of the first differential amplifier and differential output terminals of the third differential amplifier being connected to the differential pulse signal output terminals.

5. The circuit according to claim 1, wherein the detector and the storage device are formed with a sample and hold circuit which samples the periodic signal at a time corresponding to each pulse of the pulse signal to produce the voltage signal corresponding to the voltage of the periodic signal, and then stores the voltage signal detected at the time of each pulse.

6. The circuit according to claim 5, wherein the sample and hold circuit comprises:
   an input amplifier receiving the periodic signal from the oscillator and producing the voltage signal corresponding to the periodic signal;
   a gate switching between conduction and non-conduction according to the pulse signal;
   a storing element storing the voltage signal through the gate; and
   a buffer amplifier for receiving the voltage signal from the storing element and outputting the voltage signal to the oscillator.

7. The circuit according to claim 2, wherein the phase detector and the storage device are formed with a sample and hold circuit which samples the periodic signal at a time corresponding to each pulse of the pulse signal to produce the voltage signal corresponding to the voltage of the periodic signal, and then stores the voltage signal detected at the time of each pulse.

8. The circuit according to claim 7, wherein the sample and hold circuit comprises:
   an input amplifier receiving the periodic signal from the oscillation means and producing the voltage signal corresponding to the periodic signal;
   a gate switching between conduction and non-conduction according to the pulse signal;
   a storing element storing the voltage signal through the gate means; and
   a buffer amplifier for receiving the voltage signal from the storing element and outputting the voltage signal to the oscillator.

9. The circuit according to claim 1, further comprising a loop filter connected between the phase detector and the oscillator.

10. A clock recovery circuit comprising:
    a sampling pulse generator for generating a sampling pulse signal of a predetermined pulse width at each level transition of an input signal having an NRZ (non return to zero) signaling method;
    a sample and hold circuit for sampling a clock signal according to the sampling pulse signal and holding a voltage signal corresponding to a voltage of the clock signal at the time corresponding to the sampling pulse signal;
    a filter receiving the voltage signal and producing a controlling signal; and
    a controlled oscillator for generating the clock signal whose frequency is controlled according to the controlling signal received from the filter.

11. The clock recovery circuit according to claim 10, wherein the sampling pulse generator comprises:
    a delay circuit for delaying the input signal by a predetermined time period to produce a delayed input signal; and
    an exclusive-OR circuit for receiving the input signal and the delayed input signal to produce the sampling pulse signal.

12. The clock recovery circuit according to claim 11, wherein the delay circuit comprises:
    differential amplifier receiving the input signal and producing a differential output signal on a differential output terminals; and
    a time-constant circuit connected to the differential output terminals of the differential amplifier, for delaying the input signal to produce the delayed input signal.

13. The clock recovery circuit according to claim 12, wherein the exclusive-OR circuit comprises:
    a first differential amplifier receiving the input signal and producing a first and second differential output signals on a first and second differential output terminals, respectively;
    a second differential amplifier receiving the delayed input signal, the second differential amplifier being connected in series to the first differential output terminal of the first differential amplifier, and differential output terminals of the second differential amplifier being connected to differential sampling pulse signal output terminals; and
    a third differential amplifier receiving the delayed input signal, the third differential amplifier being connected in series to the second differential output terminal of the first differential amplifier and differential output terminals of the third differential amplifier being connected to the differential sampling pulse signal output terminals.

14. The clock recovery circuit according to claim 10, wherein the sample and hold circuit comprises:
    an input amplifier receiving the clock signal from the controlled oscillator and producing the voltage signal corresponding to the clock signal;
    gate means for switching between conduction and non-conduction according to the sampling pulse signal;
    storing means for storing the voltage signal through the gate means; and
    a buffer amplifier for receiving the voltage signal from the storing means and outputting the voltage signal to the filter.

15. The clock recovery circuit according to claim 11, wherein the sample and hold circuit comprises:
    an input amplifier receiving the clock signal from the controlled oscillator and producing the voltage signal corresponding to the clock signal;
    gate means for switching between conduction and non-conduction according to the sampling pulse signal;
    storing means for storing the voltage signal through the gate means; and
    a buffer amplifier for receiving the voltage signal from the storing means and outputting the voltage signal to the filter.

16. A phase-locked loop circuit comprising:
    a phase detector for detecting and storing a voltage signal corresponding to a voltage of a periodic signal at each level transition of an input signal having an NRZ (non return to zero) signaling method;
    a loop filter receiving the voltage signal from the phase detector and producing a voltage controlling signal; and
    a voltage-controlled oscillator for generating the periodic signal whose frequency is controlled according to the voltage controlling signal received from tho loop filter.

17. The phase-locked loop circuit according to claim 16, wherein the phase detector comprises a sample and hold circuit which comprises:

an input amplifier receiving the periodic signal from the voltage-controlled oscillator and producing the voltage signal corresponding to the periodic signal;

gate means for switching between conduction and non-conduction at each level transition of the input signal;

storing means for storing the voltage signal through the gate means; and a buffer amplifier for receiving the voltage signal from the storing means and outputting the voltage signal to the loop filter.

18. A method for recovering a clock signal from an input signal having an NRZ (non return to zero) signaling method, the method comprising the steps of:

generating a pulse signal of a predetermined pulse width at each level transition of the input signal;

detecting a voltage signal corresponding to a voltage of a periodic signal at a time corresponding to each pulse of the pulse signals;

storing the voltage signal detected at the time of each pulse; and generating the periodic signal whose frequency is controlled based on the voltage signal.

19. The method according to claim 18, wherein the step of generating the pulse signal comprises the steps of:

delaying the input signal by a predetermined time period to produce a delayed input signal; and performing an exclusive-OR function on the input signal and the delayed input signal to produce the pulse signal.

* * * * *